United States Patent [19]

Zeiger

[11] Patent Number: 5,424,644
[45] Date of Patent: Jun. 13, 1995

[54] PROBEHEAD FOR THE MEASURING OF MAGNETIC RESONANCE

[75] Inventor: Heinz D. Zeiger, Waldbronn, Germany

[73] Assignee: Bruker Analytische Messtechnik GmbH, Rheinstetten-Forchheim, Germany

[21] Appl. No.: 83,652

[22] Filed: Jun. 25, 1993

[51] Int. Cl.⁶ ............................................. G01R 33/20
[52] U.S. Cl. .................................................... 324/318
[58] Field of Search ............... 324/300, 307, 309, 316, 324/318, 322, 321

[56] References Cited

U.S. PATENT DOCUMENTS

| | | | |
|---|---|---|---|
| 4,446,429 | 5/1984 | Froncisz et al. | 324/316 |
| 4,607,224 | 8/1986 | Codrington | 324/318 |
| 4,714,886 | 12/1987 | Halpern | 324/316 |
| 4,899,111 | 2/1990 | Pines | 324/321 |
| 4,968,939 | 11/1990 | Pines | 324/321 |

OTHER PUBLICATIONS

Rev. Sci. Instrum. 60(10), Oct. 1989, "Double rotor for solid-state NMR" by A. Samoson and A. Pines, pp. 3239-3241.

NMR Microscopy, brochure, 1991, by Bruker Analytische Messtechnik GmbH.

*Primary Examiner*—Michael J. Tokar
*Attorney, Agent, or Firm*—Claude A. S. Hamrick

[57] ABSTRACT

A probehead is described for carrying out magnetic resonance imaging measurements on a sample. The sample is located inside a probehead transmission/detection unit in a magnetic field of a predetermined direction. Moreover, the sample may be turned relative to the direction about at least one axis. The transmission/detection unit is a split ring resonator. The split ring resonator may be turned about its resonator axis and may be coupled by coupling means for coupling rf energy to or from, respectively, the split ring resonator. The coupling means are arranged in a stationary position relative to the split ring resonator and are coaxial to the resonator axis.

21 Claims, 4 Drawing Sheets

PROBEHEAD FOR THE MEASURING OF MAGNETIC RESONANCE

FIELD OF THE INVENTION

The invention relates to an apparatus for measuring magnetic resonance in samples wherein the sample is located inside a transmission/detection unit of the probehead within a magnetic field of a predetermined direction and which sample can be turned about at least one first axis with respect to this direction.

BACKGROUND OF THE INVENTION

Probeheads of the kind mentioned above are generally known, e.g. to carry out measurements on anisotropic samples by means of magnetic resonance. Units for that purpose may, for example, be found in the textbook by Hausser, K. H. et al. "NMR für Mediziner und Biologen, Springer Verlag 1989".

In the brochure "NMR Microscopy", published by applicant in 1991, a measuring method is described denoted by the acronym STRAFI (Stray Field Imaging). This measuring method is used to record two and three dimensional image representations of solid state samples. Since it is known that solid state samples have very short spin-spin relaxation times, and therefore large line widths, the field gradients, which can be applied with conventional nuclear resonance devices, are not sufficient, to achieve a sufficiently good slice selection.

The above mentioned STRAFI-method makes use of the fact that magnetic coils as used in nuclear resonance technique, exhibit a stray field at their edge which is strongly inhomogeneous, e.g. it shows a very strong field decrease and can therefore be used as a gradient field with strong field gradient. If a solid state sample is brought into this stray field at the edge of the magnet coil, this sample is located in a sufficiently pronounced gradient field whose field gradient is so large that the required slice selection is achieved with the available line width.

Since the stray field is a quantity predetermined by the apparatus, it is, however, impossible to switch the gradient as with the usual measuring gradients in nuclear resonance devices. Therefore, with the STRAFI method one is forced to move the solid state sample in the stray field in a predetermined manner, in order to facilitate the desired two or three dimensional image representation.

In the above mentioned brochure an experiment is described where solid state samples were brought into the stray field of a superconducting magnetic coil, whose field gradients at the location of the sample were in the order of 40 to 80 T/m, with a rated field of the magnetic coil between 4.7 and 9.4 T.

In order to achieve the desired two and three dimensional image representations of the sample, the sample was moved by computer controlled step motors on the one hand in axial direction and on the other hand turned about one or two axes perpendicular to the magnet axis, this, too, by means of step motors. Further details of the apparatus used cannot be taken from the above mentioned brochure.

If in such experiments a sample shall be turned about one or even about two axes, this imposes special requirements on the design of the transmission/detection unit used, in view of the extremely confined spatial circumstances (to reach a high filling factor).

If, for example, the transmission/detection unit is designed as a Helmholtz radio frequency coil system, consisting of two partial coils comprising a central gap through which the sample may be manipulated, this has the consequence of an insufficient homogeneity of the radio frequency field. Moreover, in this case, because of the relatively high electric field strengths, the tuning and coupling conditions change, in particular if the sample is turned by tilting same in the gap plane, since a Helmholtz configuration does not act in a strictly rotation symmetrical way because of the necessary connection of the two partial coils. As a consequence of such a configuration, the measuring result is distorted by systematic influences, if the sample is turned.

Therefore, it is the object of the invention to improve a probehead of the above mentioned kind in that the sample turning is possible in a constructionally simple way wherein the homogeneity of the radio frequency field and/or the tuning or coupling conditions, respectively, should not suffer by turning of the sample.

This object is on the one hand achieved according to the invention in that the transmission/detection unit is a split ring resonator, which is, preferably together with the sample, turnable about its resonator axis and which can inductively be coupled to via coupling means, wherein the coupling means is in a fixed spatial position.

The object is further achieved according to the invention in that the transmission/detection unit is a split ring resonator which is located inside the probehead in a fixed spatial position, which split ring resonator exhibits a circumferential narrow slit in its central plane.

In this way the object of the invention is completely achieved.

Surprisingly the homogeneity of a split ring resonator has turned out to be exceptionally good, in particular with the measuring frequencies around 200 MHz, which presently are usually used for imaging methods on solid state samples. A further advantage of such a resonator with low L/C-ratio is that only comparatively low electric field strengths are present with the consequence that heating of the sample and detuning of the resonance circuit by the sample are kept at a negligible low level. Further it turned out that the radio frequency field of a split ring resonator remains widely unchanged if the split ring resonator is coupled via coupling means coaxial to the resonator axis and if the split ring resonator is turned about the resonator axis relative to the coupling means.

In contrast to the possibilities of a Helmholtz configuration described further above, where the partial coils as well as the coupling means are arranged in a fixed spatial position and unchanged with respect to each other, the invention uses a trick where the coupling means stays in a fixed spatial position inside the probehead and the split ring resonator turns together with the sample relative to the coupling means.

A split ring resonator has the further advantage that a sample located inside the split ring can easily be manipulated since the sample can be turned about a further axis perpendicular to the resonator axis without a considerable distortion of the field distribution in the split ring. At this point it should again be mentioned that the turning of the sample about the first axis is already effected by the turning of the split ring itself, so that during this first turning no relative movement of sample and transmission/detection unit occurs. Only during the turning about a second axis perpendicular to the resonator axis, a relative movement of sample and split ring is necessary, this turning may, however, as mentioned above, be performed with only a very minor influence onto the field distribution inside the split ring.

The feature to use a split ring resonator which is spatially fixed inside the probehead as a transmission/detection unit, which split ring resonator has in its central plane a circumferential narrow slit, has the advantage that coupling may also be effected capacitively, or that in the case of inductive coupling the coupling components do not move. This may in certain cases counterbalance the disadvantage that in this case the sample cannot be turned about the resonator axis by full 360°.

In a preferred embodiment of the invention the coupling means are in a fixed spatial position with respect to the split ring resonator and coaxial to the resonator axis.

This feature has the advantage that during the use of the apparatus according to the invention, the coupling and tuning conditions change as little as possible.

In a further preferred embodiment of the invention the coupling means are an essentially circular coupling loop.

This feature has the advantage that the rotational symmetry of the configuration leads on the whole to an extremely low influence onto the field distribution as well as the coupling conditions if the split ring is turned relative to the coupling means.

In a further preferred embodiment of the invention the sample inside the split ring resonator can additionally be turned about a second axis which is tilted with respect to the resonator axis and which is preferably perpendicular to this axis.

This feature is particularly advantageous if three dimensional image representations shall be produced and it has already been mentioned that this additional turning of the sample about a second axis is possible without problems for a split ring resonator.

In a practical embodiment of the apparatus according to the invention, the split ring resonator comprises a split ring being arranged in, preferably supported by, a support ring with a larger diameter, wherein the support ring is mounted in guiding roller bearings and connected to drive means for the turning.

This feature has the advantage that the electrical function of the split ring is separated from the mechanical function of turnability, so that in order to turn the split ring, drive means may be applied with no consideration for the special design of the split ring and that the split ring may easily be exchanged if necessary, e.g. for adaption RF-wise to a new measuring frequency or geometrically to a new sample.

In a preferred improvement of the embodiment the support ring comprises a sample holder pointing radially inward and being turnable about the second axis and which can be operated from the outer circumference of the support ring.

This measure has the advantage that the turning of the sample about the second axis, perpendicular to the resonator axis, can be adjusted in a simple way from the outside of the support ring.

This may be achieved particularly well in an improvement of this embodiment where the support ring comprises a reference mark in such a way that the support ring may be locked in a well defined turning position about the resonator axis, whereby in this turning position operating means mounted inside the probehead can be connected to the turnable sample holder.

This feature has the advantage that in a first step by a full turning of the support ring about 360° a first group of measuring values can be recorded wherein the sample is in a particular turning position about the second rotation axis. When this defined turning position (zero position) is reached again, the sample can be turned about the second turning axis in a defined way by an angular increment by means of the operation means mounted in the probehead. Subsequently, the support ring is again turned about 360° in order to record a second group of measuring values for defined angular positions of the support ring, etc..

In a further group of embodiments the split ring comprises one or more capacitors in its gap, wherein the capacitor is preferably connected to the support ring by an insulating support being radially arranged inside the support ring.

This feature has the advantage that on the one hand the split ring can be optimized with respect to its electrical properties (reduction of losses in the electric field) by providing the capacitor, on the other hand the thus required capacitor is also used mechanically to provide for necessary support of the split ring in the support ring.

Further advantages of the invention will appear from the specification and the attached drawing.

It is understood that the features that have been mentioned before and that will be described hereafter may be used not only in the stated combinations, but also in any other combination or each alone, without departing from the scope of the present invention.

An embodiment of the invention is represented in the drawing and will be described in more detail in the following description.

DESCRIPTION OF THE PREFERRED EMBODIMENTS

Figure 1:
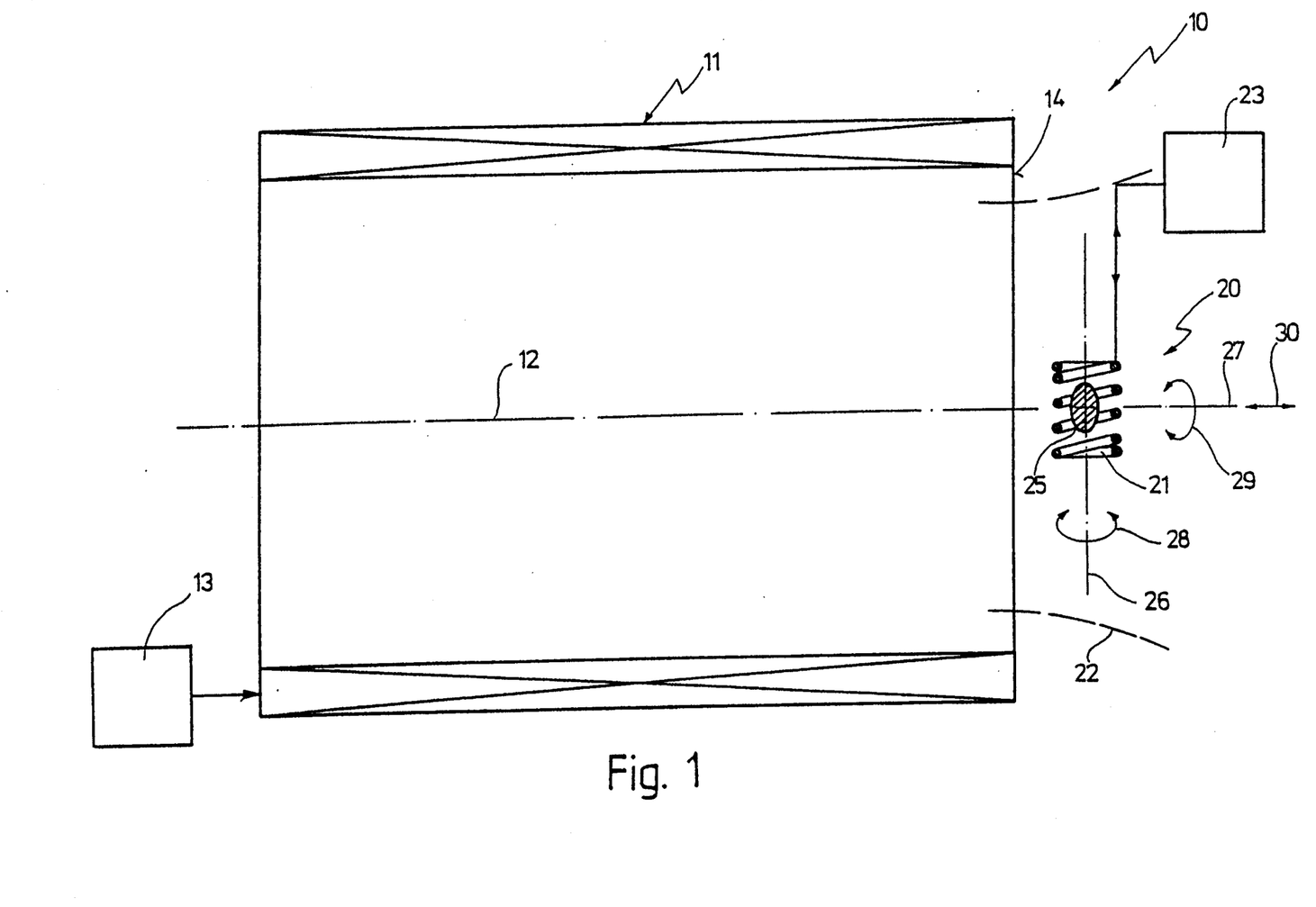
FIG. 1 A largely schematic block diagram of an apparatus for measuring magnetic resonance.

In FIG. 1, 10 designates as a whole a nuclear resonance apparatus of generally conventional design. If, hereinafter, the invention is described with reference to a nuclear resonance apparatus, this implies by no means that the invention is limited to the method of nuclear resonance. It is rather also possible, to use the invention with other methods of magnetic resonance, for example with paramagnetic electron spin resonance.

The nuclear resonance apparatus 10 according to FIG. 1 comprises a magnet 11 which is wound in the kind of a solenoidal coil. Magnet 11 has a longitudinal axis 12 corresponding to the magnetic field axis. Magnet 11 is connected to an only schematically represented power supply 13 which for resistive or superconductive magnet systems, respectively, is of the correspondingly required design.

Close to a radial front side 14 of magnet 11, a probehead 20 is located. Probehead 20 essentially consists of a transmission/detection unit 21, which therefore is located in the stray field 22 of magnet 11. The transmission/detection unit 21 is connected to a transmission/detection apparatus 23, also of conventional design.

A sample 25 is situated inside the transmission/detection unit 21. Sample 25 is turnable about a first axis 26 which is directed perpendicularly to a longitudinal axis 12 of magnet 11. In addition, sample 25 is turnable about a second axis 27, which is perpendicular to the first axis 26 and which can for example coincide with the longitudinal axis 12 of magnet 11, or which may, however, also extend in an oblique direction with respect to this axis. The turning movements of sample 25 performed in this way are represented in FIG. 1 by arrows 28 and 29. Finally, an arrow 30 indicates that the transmission/detection unit 21 can as a whole be shifted along longitudinal axis 12 of magnet 11.

Figure 2:
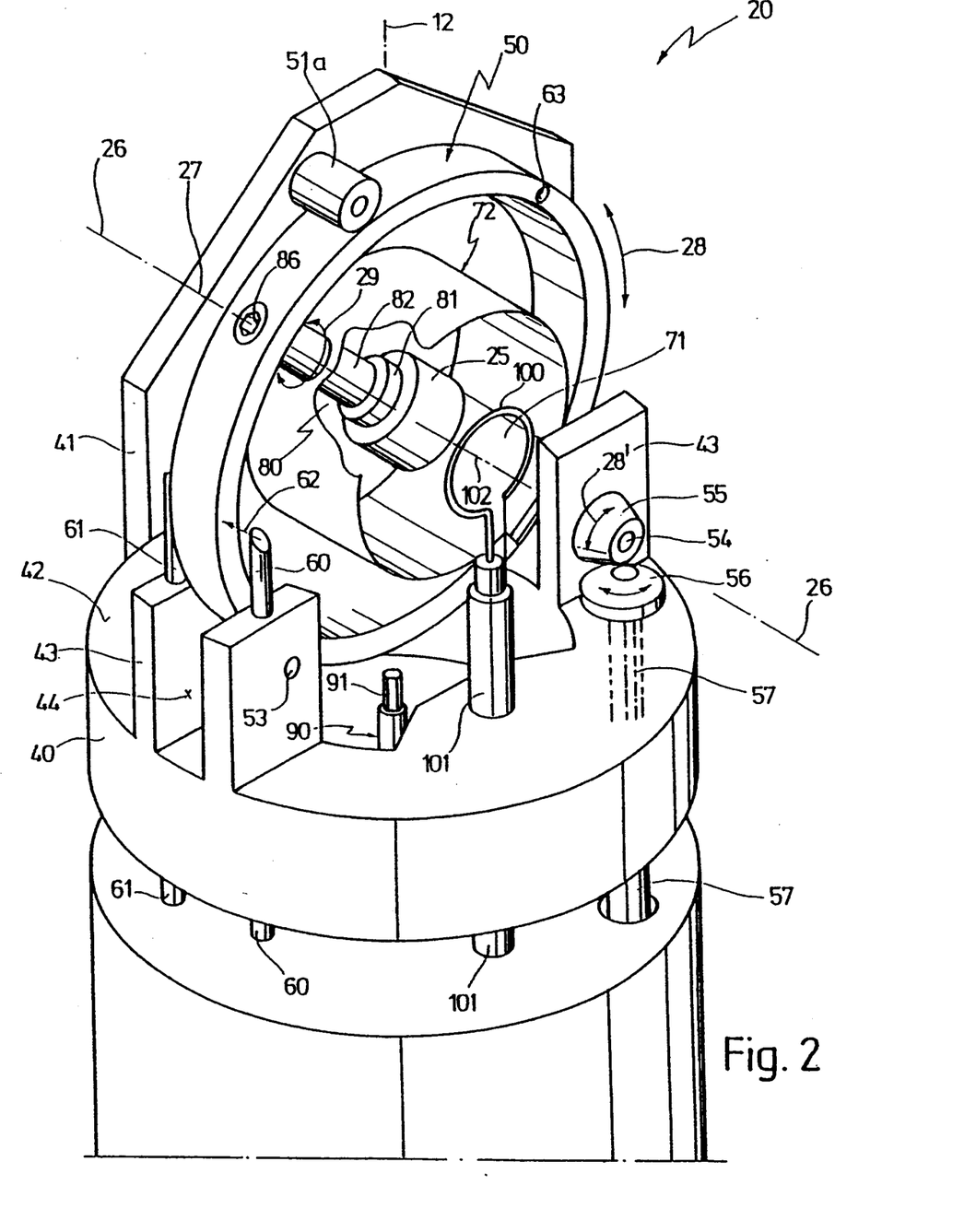
FIG. 2 A schematic perspective view, partly cut away, of an embodiment of a probehead which may be used within the frame of the present invention.
Figure 3:
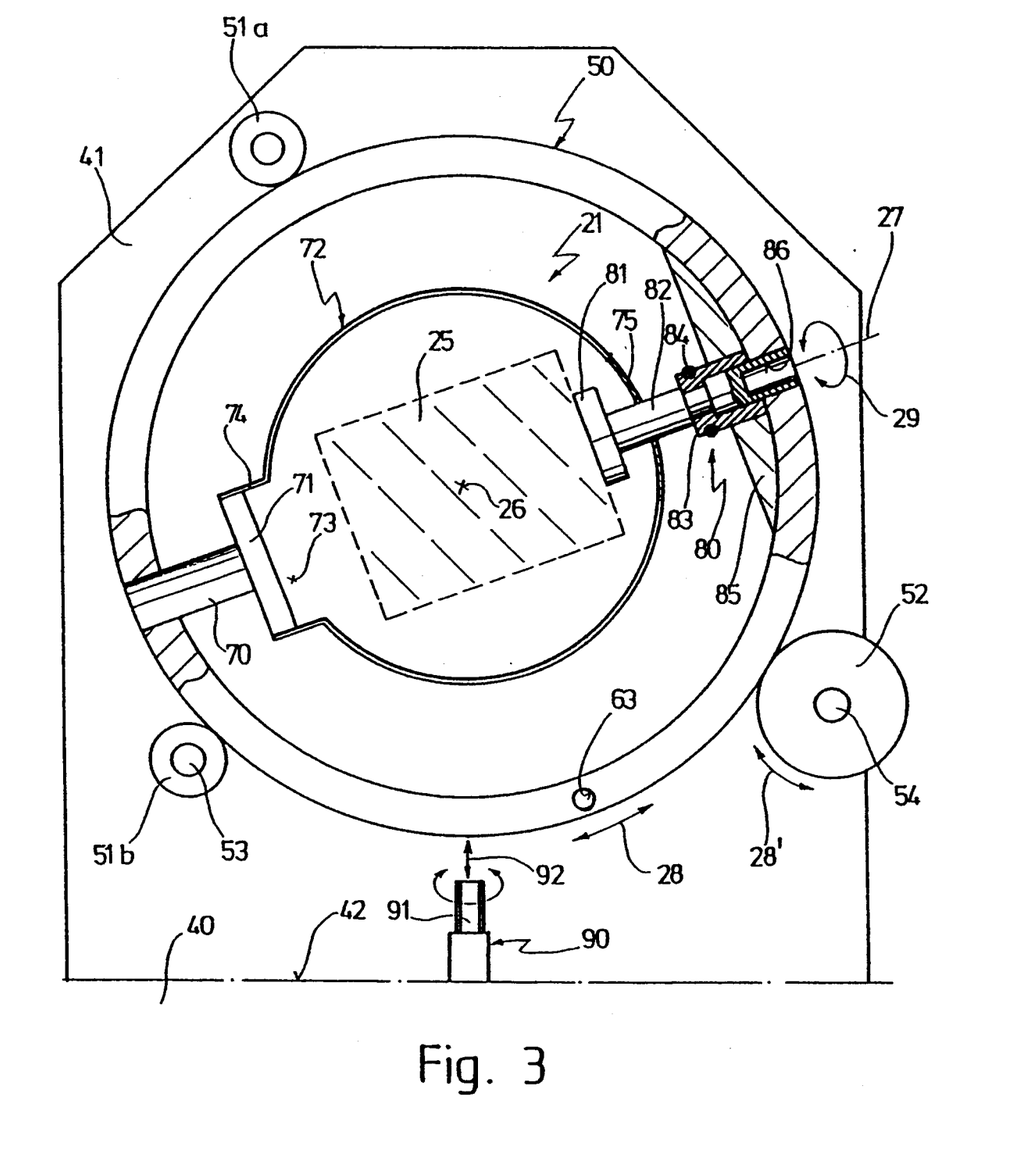
FIG. 3 A front view of the probehead according to FIG. 2, partly in a cross section.

Details of the probehead 20 are shown in FIGS. 2 and 3. In FIGS. 2 and 3 the means permitting the shifting of the probehead 20 along the longitudinal axis 12 of magnet 11 are not shown; however, such means are well known and therefore need not be explained again.

The end of probehead 20 represented in FIGS. 2 and 3 comprises a probehead frame 40, turning on one side into an axial flat flange 41.

Pairs of guiding ribs 43 project in an axial direction from a radial surface 42 of the probehead frame 40, which pairs of guiding ribs 43 enclose a gap 44 of predetermined width.

The pairs of guiding ribs 43 are a sidewise support of a support ring 50 whose thickness is only slightly smaller than the width of gap 44.

As is particularly well apparent from FIG. 3, the support ring 50 is guided in the left half of FIG. 3 at the upper and lower end of flange 41 in the flange plane by guiding roller bearings 51a, 51b. On the right hand lower side of FIG. 3 a frictional wheel is provided as third guiding means. The guiding roller 51b is turnable about a first axis 53 which is supported by the pair of guiding ribs 43, being the front ones in FIG. 2. The frictional wheel 52, however, is turnable about a second axis 54 which is mounted in the rear pair of guiding ribs 43, shown in FIG. 2, and which frictional wheel 52 comprises at the outside of the pair of guiding ribs 43 a first bevelled wheel 55. The first bevelled wheel 55 fits into a second bevelled wheel 56 attached to the end of a drive shaft 57. The drive shaft 57 reaches axially across the probehead 20 and can be operated at its far end (not shown).

If the drive shaft 57 is turned, the bevelled wheels 55, 56 engage and the frictional wheel 52 turns, as indicated in FIG. 3 by reference no 28. As a consequence of the turning of frictional wheel 52, support ring 50, too, is turned, as indicated in FIGS. 2 and 3 by arrow 28.

In order to enable the recognition of a defined turning position, the front pair of guiding ribs 43 of FIG. 2 comprises a pair of light guide rods 60, 61. The first light guide rod 60 emits a beam of light 62 which, in the position shown in FIG. 2, is reflected by the front plane of support ring 50 and therefore does not enter the second light guide rod 61.

Only if support ring 50 is in a defined turning position where a through hole 63 is in line with the top ends of the light guide rods 60, 61, light beam 62 can reach the second light guide rod 61 via through hole 63.

The light guide rods 60, 61 also run axially across probehead 20 and are at their outer ends equipped with a light source or a light detector, respectively, as generally known from the technique of light barriers.

From FIG. 3 it can clearly be recognized that at a circumferential position of support ring 50 an insulating support 70 is attached inside support ring 50 in such a way that the insulating support 70 projects radially inward. Insulating support 70 carries at its free end one or more capacitors 71 which are arranged in the gap 73 of a split ring 72. To this end, bended sections 74 are connected to side front planes of capacitors 71 at the edges of gap 73.

At the end of split ring 72 opposite to the insulating support 70, this split ring comprises a bore 75, as is apparent in FIG. 3 from the partly cut away representation of split ring 72 around bore 75.

In addition, diametrically opposite insulating support 70, a sample holder 80 is arranged at support ring 50. Sample holder 80 also projects radially inward and carries at its inner end a support plate 81 onto which sample 25 can be attached. Support plate 81 is fixed onto a turning rod 82. Turning rod 82, on its part, is axially fixed by means of an elastic collet chuck 83. Collet chuck 83 is kept permanently closed by means of an elastic ring 84. Furthermore, it is arranged in a fixed turning position inside a flange 85. Flange 85 is glued into the inner circumference of support ring 50 or otherwise permanently fixed.

Turning rod 82 penetrates collet chuck 83 and flange 85 and continues to the outer circumference of support ring 50. There the turning rod 82 comprises a hexagonal recess 86.

From the radial surface 42 of probehead frame 40 an adjustment rod 90 projects which comprises at its top end in FIG. 3 a hexagonal wrench 91. The adjustment rod 90 runs also axially across probehead 20 and can be operated from its outside (also not shown). Moreover, the adjustment rod 90 can axially be slightly shifted, as indicated in FIG. 3 by arrow 92.

The total configuration is chosen such that by means of light barrier 60, 61, 62, 63 the defined turning position of support ring 50 is recognized in the event that the turning rod 82 of the sample holder 80 is in line with adjustment rod 90. If adjustment rod 90 is shifted upwards in the direction of arrow 92 (for example against the force of a not shown spring), hexagonal wrench 91 engages hexagonal recess 86 and the turning rod 82 can be turned by a defined angular increment. If afterwards the adjustment rod 90 is again shifted downwards in the direction of arrow 92 (for example under the influence of the already mentioned spring) support ring 50 can again turn without restriction, since hexagon 91 and hexagon socket 86 are now disengaged.

Consequently, in the way described above it is possible to turn support ring 50 via drive shaft 57 by defined angular increments about resonator axis 26, for example by a full turning of 360°. Thereby sample 25 is in a fixed adjusted turning position with respect to the second axis 27. If finally the starting position is reached again, the turning rod 82 can be turned by the above mentioned angular increment in the above mentioned kind, in order to perform afterwards another turning of support ring 50 and to record a second series of measuring values.

For the magnetic coupling into or coupling out of the split ring resonator, a coupling loop 100 is used which has an essentially circular shape. The coupling loop 100 is spatially fixed, i.e. arranged in a fixed position with respect to probehead frame 40. It is connected to a cable 101 which runs also axially across probehead 20 to the outside. Coupling loop 100 has a loop axis 102 coinciding with the resonator axis, or the first axis 26, respectively. Turning of split ring 72 about this axis 26 does therefore not change the coupling conditions between coupling loop 100 and split ring 72.

It is understood that in the frame of the present invention numerous variations are possible without leaving the frame of the present invention.

Figure 4:
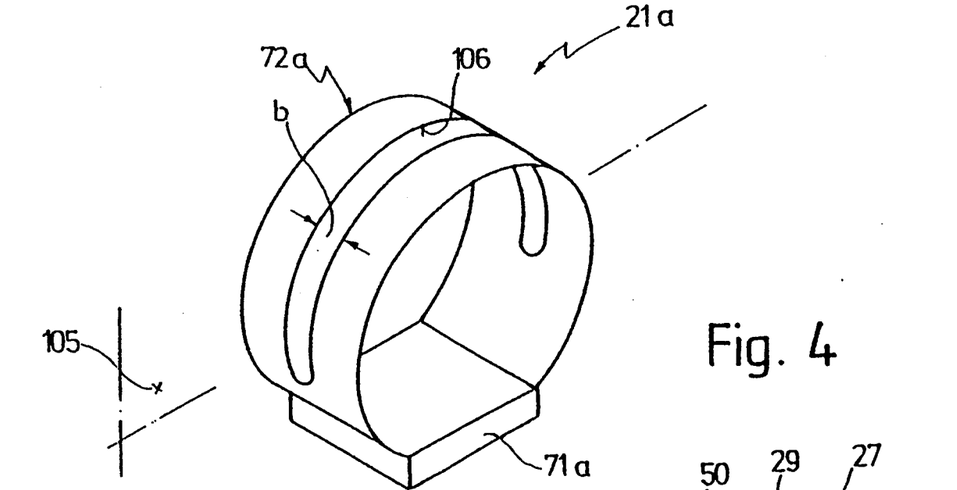
FIG. 4 A schematic perspective view of a further embodiment of a transmission/detection unit according to the invention.
Figure 5:
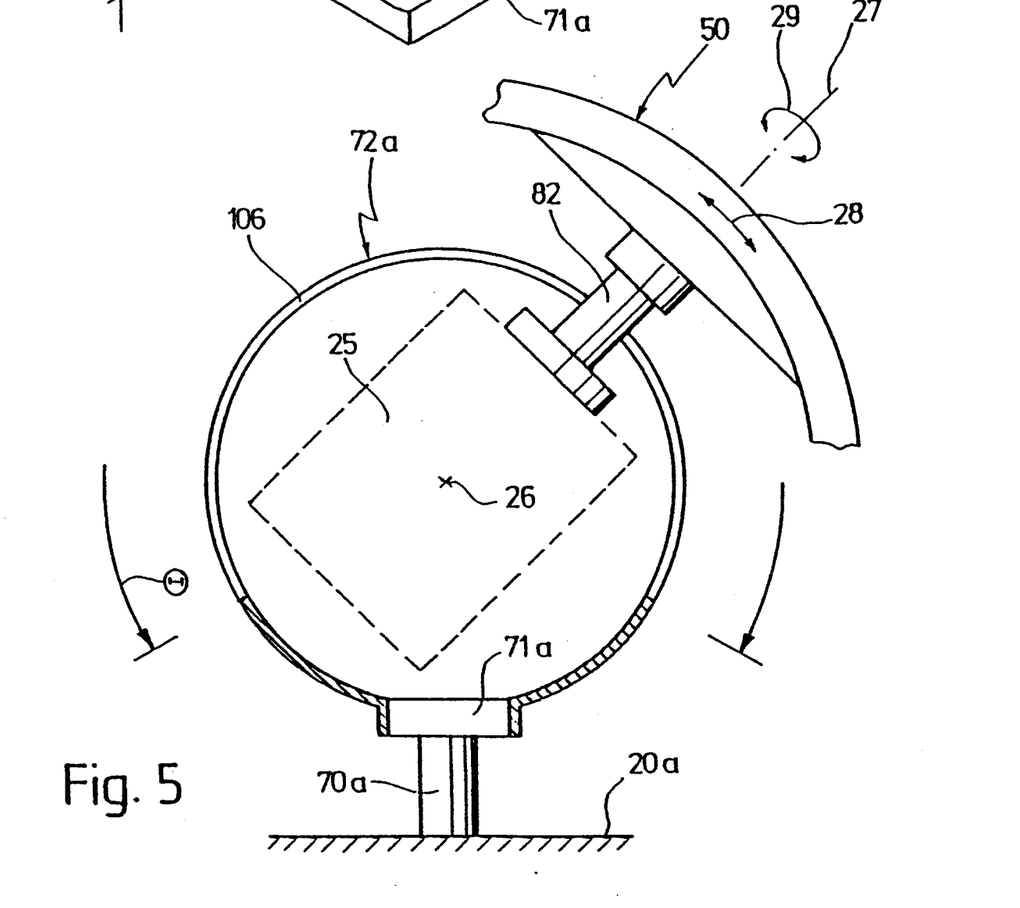
FIG. 5 A side view, cross sectional, across the configuration according to FIG. 4.

In the FIGS. 4 and 5 a further embodiment of the invention is shown extremely schematically. Parts which are unchanged with respect to the first embodiment of FIGS. 1 through 3 are represented by identical reference numerals, similar parts are indicated by the addition of an "a". The transmission/detection unit 21a according to FIGS. 4 and 5 essentially consists again of a split ring 72a which is closed via one or several capacitors 71a.

The particular feature of transmission/detection unit 21a, as compared to that of the FIGS. 1 through 3, is that the split ring 72a is attached to the probehead 20a via an insulating support 70a in a spatially fixed position, as indicated in FIG. 5 extremely schematically. A further exceptional feature consists of the fact that the split ring 72a comprises a circumferential slit 106 in a central plane 105 (FIG. 4).

The circumferential slit 106 has a width b which is calculated such that the turning rod 82 can be moved in the circumferential slit 106 in circumferential direction. The circumferential slit 106 is in its circumferential extension essentially determined by the dimensions of the capacitors 71a, preferably the circumferential angle of the circumferential slit 106 indicated by Θ in FIG. 5, comprises considerably more than 180°.

If the split ring 72a is used in a configuration according to FIG. 5, i.e. inside a turnable support ring 50, the sample 25 may be turned about the first axis 26 by turning the support ring 50, actually within the range of angle Θ. A turning about the second axis 27 is also possible in the way already discussed in detail.

The constructional implementation is not shown in detail in FIG. 5, it is however understood that the insulating support which is only indicated schematically, should expediently run along a part of its length parallel to the first axis 26, in order to enable a free turning of support ring 50.

In any case, in this way a turning of sample 25 about both axes 26 and 27 can be achieved wherein the turning about the first axis 26 cannot cover full 360°, the turning about the second axis 27, however, can be performed over complete 360°.

What is claimed is:

1. A probehead for location within a magnetic field to measure the magnetic resonance in a sample, comprising:
   means forming a probehead frame;
   a split ring resonator having a first axis fixed in position relative to said frame;
   sample holding means for positioning a sample along said first axis and within a volume of space circumscribed by said split ring resonator;
   means carried by said frame for supporting and for turning at least one of said sample and said split ring resonator about said first axis; and
   inductive coupling means affixed to said frame and having a predetermined relationship to said first axis for coupling an rf signal to or from said split ring resonator.

2. The probehead of claim 1, wherein said inductive coupling means is arranged in a stationary position with respect to said split ring resonator and is coaxial to said first axis.

3. The probehead of claim 2, wherein said coupling means is an essentially circular coupling loop.

4. The probehead of claim 1, wherein means are provided for additionally turning said sample inside said split ring resonator about a second axis extending obliquely with respect to said first axis.

5. The probehead of claim 4, wherein said second axis is perpendicular to said first axis.

6. The probehead of claim 1, wherein said split ring resonator comprises a split ring arranged inside a support ring of larger diameter than that of said split ring, said support ring being mounted in guiding roller bearings and connected to turning drive means.

7. The probehead of claim 6, wherein said sample holding means includes a sample holder carried by said support ring and extending radially inwardly of said support ring and being turnable about a second axis angularly intersecting said first axis, said sample holder being adapted to be operated from an outer circumference of said support ring.

8. The probehead of claim 7, wherein said support ring includes a reference marker, such that said support ring can be set at a predetermined turning position about said first axis, said probehead further comprising operating means carried by said frame and adapted to operatively engage and rotate said sample holder when said support ring is in said predetermined turning position.

9. The probehead of claim 6, wherein said split ring has a gap and comprises a capacitor in said gap.

10. The probehead of claim 9, wherein said split ring is mounted in said support ring.

11. The probehead of claim 10, wherein a capacitor is connected to said support ring via an insulating supporting arranged radially inside said support ring.

12. A probehead for location within a magnetic field to measure magnetic resonance in a sample, comprising:
    means forming a probehead frame;
    a split ring resonator affixed to said frame and having a first axis, said split ring resonator further having a narrow circumferential slit formed therein; and
    sample holding means extending through said narrow circumferential slit for positioning a sample along said first axis and for turning said sample about said first axis.

13. The probehead of claim 12, wherein said narrow circumferential slit covers more than 180° of peripheral circumference.

14. The probehead of claim 12, wherein means are provided for additionally turning said sample inside said split ring resonator about a second axis extending obliquely with respect to said first axis.

15. The probehead of claim 14, wherein said second axis is perpendicular to said first axis.

16. The probehead of claim 12, wherein said split ring resonator comprises a split ring arranged inside a support ring of larger diameter than that of said split ring, and wherein said support ring is mounted in guiding roller bearings and is connected to turning drive means.

17. The probehead of claim 16, wherein said support ring comprises a sample holder extending radially inwardly and being turnable about a second axis, said sample holder being adapted to be operated from an outer circumference of said support ring.

18. The probehead of claim 17, wherein said support ring further comprises a reference marking means and can be set at a predetermined turning position about said first axis, and wherein in said predetermined turning position operating means carried by said frame can be connected to said sample holder.

19. The probehead of claim 16, wherein said split ring has a gap and comprises a capacitor in said gap.

20. The probehead of claim 19, wherein said split ring is mounted in said support ring.

21. The probehead of claim 20, wherein a capacitor is connected to said support ring via an insulating supporting arranged radially inside said support ring.

* * * * *

UNITED STATES PATENT AND TRADEMARK OFFICE
CERTIFICATE OF CORRECTION

PATENT NO. : 5,424,644
DATED : June 13, 1995
INVENTOR(S) : Heinz Zeiger

It is certified that error appears in the above-indentified patent and that said Letters Patent is hereby corrected as shown below:

On the title page:

Please add the priority claim of German patent application P 42 23 909.5 filed June 30, 1992 as follows:

On the cover sheet of the patent, after the line "[22] Filed: Jun. 25, 1993",

--[30] Foreign Application Priority Data
Jun. 30, 1992 [DE] Fed. Rep. of Germany ...... P4223909.5--

Signed and Sealed this

Thirtieth Day of July, 1996

Attest:

BRUCE LEHMAN

*Attesting Officer*  *Commissioner of Patents and Trademarks*